US006972509B2

(12) United States Patent
Ikeda et al.

(10) Patent No.: US 6,972,509 B2
(45) Date of Patent: Dec. 6, 2005

(54) SURFACE ACOUSTIC WAVE DEVICE METHOD OF MANUFACTURING THE SAME, AND ELECTRONIC COMPONENT USING THE SAME

(75) Inventors: Kazuo Ikeda, Hirakata (JP); Yasumichi Murase, Nishinomiya (JP); Kazunori Nishimura, Yawata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/311,711

(22) PCT Filed: Apr. 17, 2002

(86) PCT No.: PCT/JP02/03808

§ 371 (c)(1),
(2), (4) Date: Apr. 22, 2003

(87) PCT Pub. No.: WO02/087080

PCT Pub. Date: Oct. 31, 2002

(65) Prior Publication Data

US 2003/0160541 A1    Aug. 28, 2003

(30) Foreign Application Priority Data

| Apr. 19, 2001 | (JP) | ............................. 2001-121136 |
| Apr. 25, 2001 | (JP) | ............................. 2001-127435 |
| Nov. 27, 2001 | (JP) | ............................. 2001-360577 |
| Dec. 5, 2001 | (JP) | ............................. 2001-371249 |

(51) Int. Cl.$^7$ ............................................. H03H 9/25
(52) U.S. Cl. ................................................ 310/313 D
(58) Field of Search .................................... 310/313 D (56) References Cited

U.S. PATENT DOCUMENTS

| 4,278,492 | A | * | 7/1981 | Cross et al. ................... 216/59 |
| 5,374,908 | A | * | 12/1994 | Wright ........................ 333/195 |
| 6,034,578 | A | * | 3/2000 | Fujita et al. ................ 333/193 |
| 6,486,591 | B2 | * | 11/2002 | Nishihara .................... 310/364 |
| 6,750,592 | B2 | * | 6/2004 | Takahashi et al. ...... 310/313 D |
| 6,754,950 | B2 | * | 6/2004 | Furukawa et al. ............ 29/832 |

FOREIGN PATENT DOCUMENTS

| JP | 63-204809 | * | 8/1988 | ............ H03H 3/08 |
| JP | 63-204809 A | | 8/1988 | |
| JP | 2-70114 | | 3/1990 | |
| JP | 2-70114 A | | 3/1990 | |
| JP | 02-070114 | * | 9/1990 | .......... H03H 9/145 |

(Continued)

Primary Examiner—Thomas M. Dougherty
(74) Attorney, Agent, or Firm—McDermott Will & Emery LLP (57) ABSTRACT

A surface acoustic wave (SAW) device includes a piezoelectric substrate, and on this substrate there are provided comb electrodes for forming an inter digital transducer (IDT), reflector electrodes placed closely along a traveling direction of a surface wave generated by the IDT, and a frame-like short-circuited auxiliary electrode having a width varying depending on its portions. This structure allows to uniform electric charges overall the electrode-surfaces, where the electric charges are generated in a heat treatment applied to the piezoelectric substrate during the manufacturing of the SAW device. Thus even after the device is diced into pieces, this structure can prevent damages of the electrodes or degradation in electrical properties due to an electric discharge generated by accumulated electric charges caused by pyroelectricity of the substrate.

11 Claims, 9 Drawing Sheets

FOREIGN PATENT DOCUMENTS

| | | | | |
|---|---|---|---|---|
| JP | 04-243311 | * | 8/1992 | |
| JP | 4-243311 | | 8/1992 | |
| JP | 4-243311 A | | 8/1992 | |
| JP | 2-160664 A | | 6/1993 | |
| JP | 5-160664 | | 6/1993 | |
| JP | 05-160664 | * | 6/1993 | .......... H03H 9/145 |
| JP | 0 936 734 A1 | | 8/1999 | |
| JP | 11-298289 | | 10/1999 | |
| JP | 2000-091872 | * | 3/2000 | .......... H03H 9/145 |
| JP | 2000-91872 A | | 3/2000 | |
| TW | 44 9963 | | 8/2001 | |
| WO | WO99/05788 | | 2/1999 | |

\* cited by examiner

SURFACE ACOUSTIC WAVE DEVICE METHOD OF MANUFACTURING THE SAME, AND ELECTRONIC COMPONENT USING THE SAME

TECHNICAL FIELD

The present invention relates to a surface acoustic wave (SAW) device to be used in communication apparatuses, a method of manufacturing the same device, and electronic components using the same device.

BACKGROUND ART

A conventional surface acoustic wave (SAW) device has been manufactured in the following way: first, form metallic thin film on the overall surface of a piezoelectric substrate, second, apply resist thereon, expose it to light before development. Then provide it with etching, thereby forming a plurality of desired electrode patterns including desired inter-digital transducer (IDT) electrodes, grating reflector electrodes (hereinafter referred to as reflector electrodes), dicing lines surrounding the foregoing electrodes, and narrow lines coupling those elements. Finally, cut the substrate along the dicing lines into pieces of SAW devices.

In the SAW device manufactured by the foregoing method, i.e., a piezoelectric substrate is diced into the pieces, the IDT electrodes and the reflector electrodes are electrically separated, thus applying heat or distortion to the SAW device produces electric charges due to pyroelectric effect of the piezoelectric substrate. Uneven amounts of electric charges between the respective electrodes cause an electrical discharge between the IDT electrodes opposite to each other, between the reflector electrodes, or between the IDT electrode and the reflector electrode. Those discharges damage the electrodes, or degrade the electrical properties of the SAW device.

Japanese Patent Application Non-examined Publication No. H11-298289 discloses a method for overcoming the problems discussed above. According to this method, short-circuited narrow lines made of metallic thin film are provided inside dicing lines such that the narrow lines surround IDT electrodes and reflector electrodes. Then a plurality of narrow lines are provided for connecting electrically those short-circuited narrow lines made of metallic thin film with the IDT electrodes, thereby electrically uniforming electric charges produced. This structure prevents the SAW device from being damaged and degraded its electrical properties due to electric discharges. In the meantime, dicing lines are border lines that partition plural SAW devices formed on a piezoelectric substrate into pieces. The dicing line is made of the same material as the IDT electrode, and the material undergoes photo-lithography and etching before it becomes a dicing line.

In the foregoing structure, i.e., short-circuited narrow lines made of metallic thin film are provided inside the dicing lines such that the narrow lines surround the IDT electrodes and reflectors electrodes, and a plurality of narrow lines are provided for connecting electrically those short-circuited narrow lines made of metallic thin film with the IDT electrodes, there are still problems as follows: Impedance between the lines becomes higher, so that the electric charges produced cannot be sufficiently uniformed, which results in discharges between the electrodes. As a result, the electrodes are damaged or electrical properties are degraded. Those problems occur in the following cases: a case where a large amount of electric charges is produced due to a sharp change in temperature, a case of short distances between electrodes, a case where the coupled electrodes are away from each other, a case where the width of the line coupling the short-circuited line made of metallic thin film with the IDT electrode is narrow, a case where the widths of lines used for coupling are narrower than a meander line, or some parts of the line are narrower than the other parts of the line.

SUMMARY OF THE INVENTION

The present invention solves the foregoing problems and aims to provide a SAW device, a method of manufacturing the same device, and electronic components using the same device. When the SAW device of the present invention is manufactured, electric charges produced by a heat treatment applied to a piezoelectric substrate are uniformly spread over respective electrode-surfaces of the SAW device. Thus after the substrate is split into pieces of SAW devices, damages of the electrodes by an electric discharge or degradation of electrical properties accompanying the electric potential differences due to pyroelectricity of the substrate can be prevented.

In order to solve the foregoing problems, the SAW device of the present invention comprises the following elements:
  a piezoelectric substrate;
  comb electrodes forming an IDT;
  reflector electrodes to be disposed closely along a traveling direction of a surface wave generated from the IDT; and
  a frame-like short-circuited auxiliary electrode having different widths depending on its portions and to be disposed surrounding the comb electrodes and the reflector electrodes.

A method of manufacturing the SAW device of the present invention comprises the following steps:
  depositing metal to form metallic thin film on the piezoelectric substrate;
  providing a plurality of sets of the following electrodes:
    comb electrodes formed by etching the metallic thin film, the comb electrodes forming the IDT;
    reflector electrodes formed closely along a traveling direction of surface waves generated by the IDT;
    frame-like short-circuited auxiliary electrodes disposed at least around the comb electrodes and the reflector electrodes, and having widths varying depending on their portions, and
  cutting the substrate between short-circuited auxiliary electrodes adjacent to each other.

An electronic component of the present invention comprises the following elements:
  a base substrate including a leader electrode on a box-shaped bottom and a terminal electrode conductive to the leader electrode;
  a lid covering the base substrate for sealing the inside of the base substrate;
  a SAW device disposed on a bottom of the base substrate; and
  a coupling member for electrically coupling the SAW device with the leader electrode of the base substrate.

The electronic component is characterized by a use of the SAW device having the structure discussed previously.

PREFERRED EMBODIMENTS OF THE INVENTION

Exemplary embodiments of the present invention are demonstrated hereinafter with reference to the accompanying drawings.

Exemplary Embodiment 1

Figure 1A:
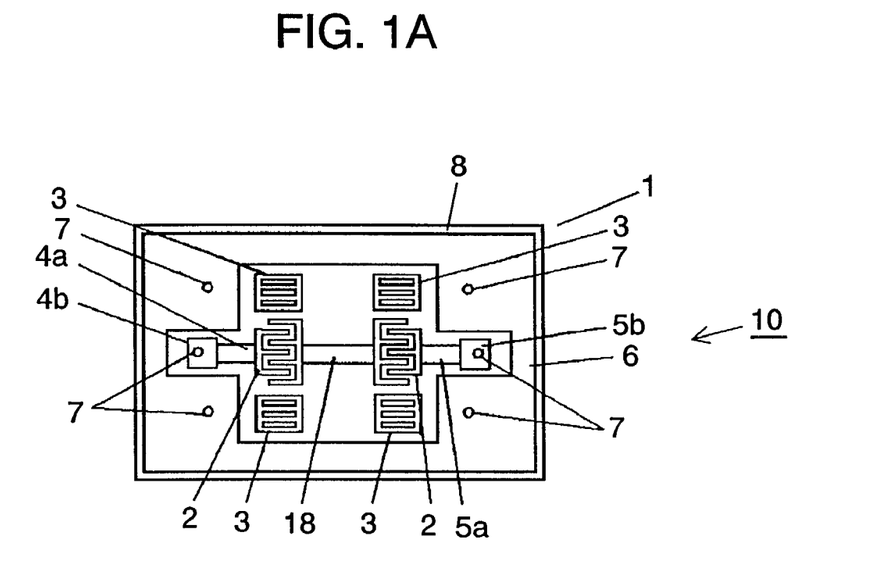
FIG. 1A is a plan view showing a structure of electrode patterns of a SAW device in accordance with a first exemplary embodiment of the present invention.
Figure 1B:
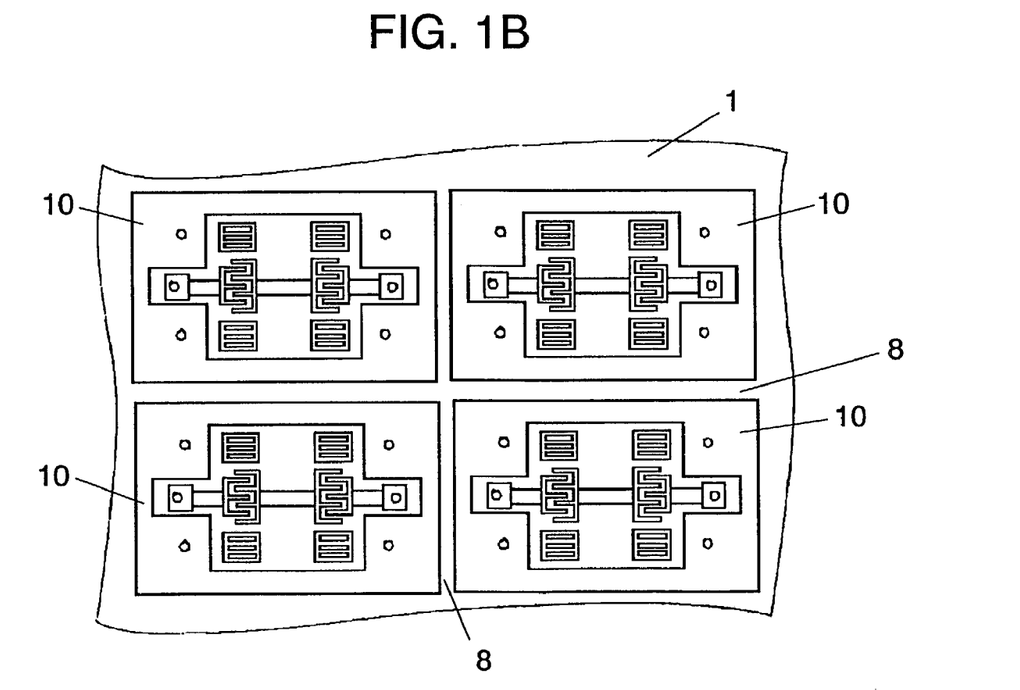
FIG. 1B is a plan view showing a plurality of the SAW devices formed on a piezoelectric substrate.
Figure 2:
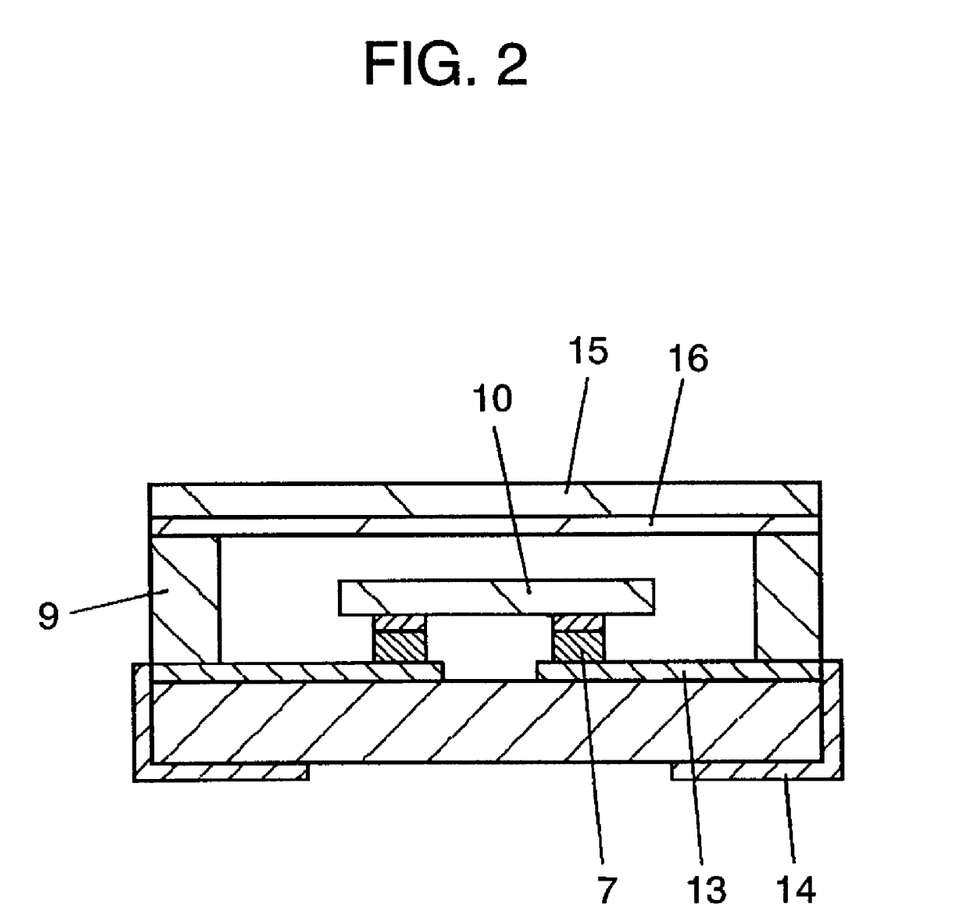
FIG. 2 is a sectional view of an electronic component using the SAW device shown in FIG. 1.

FIG. 1A is a plan view showing a structure of electrode patterns of a surface acoustic wave (SAW) device in accordance with the first exemplary embodiment of the present invention, and FIG. 1B is a plan view showing a plurality of the SAW devices, one of which is shown in FIG. 1A, formed on a substrate. FIG. 2 is a sectional view of an electronic component in which the SAW device sealed by a package comprising a base substrate and a lid.

SAW device 10 of the present invention has the following structure:

On piezoelectric substrate 1, the electrodes below are disposed:
 comb electrodes 2 forming an IDT;
 reflector electrodes 3 disposed at the vicinity of the traveling direction of surface acoustic wave excited by comb electrodes 2, reflector electrodes 3 being placed at a given distance from comb electrodes 2;
 input/output leader electrodes 4a, 5a, input/output terminal electrodes 4b, 5b and belt-like connecting electrode 18, each led out from comb electrodes 2; and
 frame-like short-circuited auxiliary electrode 6 surrounding the foregoing electrodes and having different width depending on its portions. Outside frame-like short-circuited auxiliary electrode 6, clearance 8 remains partially due to dicing, and the surface of substrate 1 is exposed in clearance 8. At given places of electrode 6 and input/output terminal electrodes 4b, 5b, bumps 7 are formed. Bumps 7 couple leader electrode 13 of base substrate 9 with terminal electrodes, 4b, 5b and auxiliary electrode 6.

As shown in FIG. 2, base substrate 9 is shaped like a box at which base leader electrode 13 is disposed, and leader electrode 13 is conductive with outer terminal electrode 14. Bumps 7 placed at given places of SAW device 10 not only electrically connects to leader electrode 13 but also mechanically fixes leader electrode 13. Bonding member 16 such as Au—Sn solder is provided to lid 15. Bonding member 16 seals the inside of base substrate 9, thereby forming an electronic component.

FIG. 1 and FIG. 2 are schematic drawings illustrating structures in accordance with the first embodiment, and those drawings do not indicate dimensional relations of respective elements. The drawings of the SAW device hereinafter used also do not indicate dimensional relations.

Some piezoelectric substance produces electric potential due to pyroelectricity or piezoelectricity. Differences of electric potential in places produce electric potential differences. If the electric potential difference exceeds a certain value, an electric discharge occurs, which sometime damages elements or degrades electrical properties. One of effective preventive measures against this problem is to lower the electric potential due to pyroelectricity or piezoelectricity, or to restore electric potential differences to a flat potential as quick as possible.

The present invention is based on the finding that reserving areas of low impedance as large as possible in the electrode pattern of SAW device 10 is an effective method for reducing electric potential differences as quick as possible. To be more specific, in the electrode patterns of SAW device 10 of the present invention, there are placed comb electrodes 2 forming an IDT, and reflector electrodes 3 disposed on both sides of comb electrodes 2 and closely along the traveling direction of the surface wave generated by comb electrodes 2, on piezoelectric substrate 1. Frame-like short-circuited auxiliary electrode 6 surrounds comb electrodes 2 and reflector electrodes 3. Short-circuited auxiliary electrode 6 is coupled with leader electrode 13 of base substrate 9 to which SAW device 10 is mounted. Leader electrode 13 is conductive with terminal electrode 14 and works as a grounding electrode. Short-circuited auxiliary electrode 6, as shown in FIG. 1A, is shaped like a frame uniformly formed, i.e., the frame is approx. symmetric with respect to the center of the IDT, on the surface of device 10 where electrodes are formed.

Further, belt-like input/output leader electrodes 4a and 5a, both coupled with each one of comb electrodes 2, face each other and have approx. the same areas. In addition to this, input/output terminal electrodes 4b and 5b coupled with input/output leader electrodes 4a and 5a also face each other and have approx. the same areas. Reflector electrodes 3 and short-circuited auxiliary electrode 6 are open electrically. The electrodes have the foregoing structure.

As discussed above, in SAW device 10, belt-like input/output leader electrodes 4a, 5a, and input/output terminal electrodes 4b, 5b have approx. the same areas. Further, short-circuited auxiliary electrode 6 is shaped like a frame substantially symmetric with respect to the center of the IDT. This structure can eliminate local areas where large amounts of electric charges due to pyroelectricity of the substrate are accumulated. Thus the electric potential differences between the patterns of respective electrodes can be substantially reduced. Therefore, even reflector electrodes 3 and comb electrodes 2 are electrically open with respect to short-circuited auxiliary electrode 6, electric charges produced at electrodes 2 and 3 can be uniformed, and thus no electric potential difference occurs between them, whereby occurrence of an electric discharge can be prevented. As a result, the electrodes of the SAW device can be prevented, and the degradation of electrical properties can be also prevented. In order to uniform the electric potentials due to the pyroelectricity for reducing the electric potential differences between the electrode patterns, it is effective to widen, as much as possible within the design allowance, electrode 6 to minimize impedance. It is also effective to place electrode 6 as close as possible to comb electrodes 2 and reflector electrodes 3. For this purpose, it is necessary to employ the max. width within the design allowance in short-circuited auxiliary electrode 6, thus the width of electrode 6 varies depending on places as shown in FIG. 1B.

Short-circuited auxiliary electrode 6, having width of as wide as possible, surrounds comb electrodes 2 and reflector electrodes 3, thereby reducing impedance, so that electric potential differences produced by accumulated electric charges due to pyroelectricity of substrate 1 can be quickly uniformed. This uniformity of the electric potential differences produces greater effect as an area of the electrodes increase, where the electrodes, including electrode 6, commonly connected in SAW device 10. Thus short-circuited auxiliary electrode 6 is desirably formed by lines having a width as wide as possible rather than by narrow lines.

In this first embodiment, short-circuited auxiliary electrode 6 is coupled with a grounding electrode of terminal electrodes 14 provided to base substrate 9, so that electric charges produced in substrate 1 can escape from electrode 6 to the outside via terminal electrode 14. Thus the influence of the electric charges due to pyroelectricity can be substantially reduced with respect to SAW device 10.

When SAW device 10 is heated, electric charges are produced because of pyroelectricity, and those electric charges occur from piezoelectric substrate 1 that has pyroelectricity. Device 10 is heated uniformly overall in the regular manufacturing process, therefore electric charges occur from overall device 10. However, in SAW device 10, there are a plurality of independent electrode patterns, and input/output terminal electrodes 4b, 5b have the largest areas in general. Thus the largest electric potential difference tends to occur in these electrodes. In order to uniform the electric charges occur in substrate 1 overall and reduce the electric potential differences, short-circuited auxiliary electrode 6 having the following features is provided: (a) surrounding comb electrodes 2 and reflector electrodes 3; (b) symmetric with respect to input/output terminal electrodes 4b, 5b ; and (c) belt-like shape with a width as wide as possible. This structure can suppress the electric discharge.

There is another method of preventing the SAW device from being damaged by the discharge due to accumulation of electric charges. For instance, between adjacent electrodes, a narrowed clearance is reserved in advance, and when an accumulation of electric charges reaches to a certain level, discharge them locally within a range of not damaging the SAW device. This method, however, is not preferable because it produces noises during an operation of the device. Accordingly, in order to prevent the SAW device from being damaged due to accumulation of electric charges, it is effective to provide frame-like short-circuited auxiliary electrode 6 close to comb electrodes 2 and reflector electrodes 3. The width of electrode 6 is preferably as wide as possible.

Further, input/output leader electrodes 4a, 5a and input/output terminal electrodes 4b, 5b are placed opposite to each other, and respective areas are approx. equal to each other. In addition to those structural preparations, frame-like short-circuited auxiliary electrode 6 is placed uniformly overall, i.e., the frame is substantially symmetric with respect to the center of the IDT. The foregoing structure eliminates regions where electric charges accumulate locally, and thus the electric potential differences can be uniformed.

In this embodiment, a pair of comb electrodes 2 and a pair of reflector electrodes 3 are prepared; however, the present invention is not limited to this preparation, and a SAW device with more multi-steps produces similar advantages to those discussed above.

Next, a method of manufacturing SAW device 10 of the present invention is demonstrated hereinafter. Form laminated metallic thin film on piezoelectric substrate 1 by, e.g., sputtering. A single-crystal substrate made of, e.g., $LiTaO_3$ or $LiNbO_3$ is used as substrate 1. The metallic thin film is formed of titan (Ti) film as the lowest layer, alloy film of Al—Sc—Cu (Aluminum-Scandium-Copper) as the middle layer, Ti film as the upper layer, and aluminum film evaporated on top of the upper layer. Next, apply photo-resist onto the foregoing metallic thin film, and undergo the film in photo-lithography process and etching process, thereby working the metallic thin film into desired electrode-patterns. After those steps, photo-lithography and etching processes are further applied so that the Al film, i.e., the upper most layer on comb electrodes 2, can be removed. As a result, soft metallic film, i.e., Al film formed by evaporation remains on input/output leader electrodes 4a, 5a, input/output terminal electrodes 4b, 5b, and short-circuited auxiliary electrode 6. This removal of Al film can be done by, e.g., wet-etching. In this case, the Al film can be removed with ease utilizing a selection ratio of etching Al vs. Ti. FIG. 1B shows the electrode-patterns thus formed.

Then cut respective clearances 8 of short-circuited auxiliary electrode 6 between adjacent SAW devices 10 with a dicing device, so that SAW devices 10 in a predetermined shape are obtained. In this embodiment, instead of cutting along dicing lines conventionally provided, cut the center of clearance 8 of electrode 6, so that the dicing lines become eventually not necessary, which can simplify the design of SAW device 10 and further downsize the SAW device.

The metallic thin film is not limited to the materials and the structure discussed above. Films of Al, Ti, Cu, Cr, Ni or an alloy of those metals can be laminated on top of the foregoing metallic thin film, or a three-layer structure formed of Al film as the lowest layer, Al—Cu alloy film as the middle layer and Ti film as the upper layer can be used. As such, various materials and structures are applicable, and any number of layers more than one can be laminated, and an order of layers is not limited to the foregoing orders. This kind of laminated electrode-film can increase withstand electric power and prevent the electrodes from being damaged by an electric discharge.

On top of the metallic thin film discussed above except at least comb electrodes 2, film of soft material such as aluminum can be evaporated by the following methods: In the case where the surface layer of the electrode film is made of Ti film, wet-etching can selectively remove the Ti film. In the case where the surface layer is made of Al film, photo-resist is formed in advance, then Al film is evaporated, i.e., a lift-off method can do it with ease.

Next, the steps of mounting SAW devices 10 thus obtained onto base substrate 9 are demonstrated hereinafter with reference to FIG. 2. After registration of leader electrodes 13 provided on the bottom of box-shaped base substrate 9 with bumps 7 formed on SAW devices 10, they are electrically coupled and devices 10 are mechanically fixed. There are several methods for this bump-coupling such as: coupling with conductive resin, coupling with soldered bumps, ultrasonic Au—Au coupling (the surface of the leader electrode and bumps 7 are formed of gold), eutectic Au—Sn coupling (Sn film is formed on the surface of leader electrode and bumps 7 are made of gold). Bumps 7 can be formed by plating or wire-bonding.

SAW devices 10 are thus fixed onto base substrate 9, then bring lid 15 into contact with base substrate 9 and heat it to fix to substrate 9, thereby forming a sealed electronic component. Lid 15 has a bonding member made of such as Au—Sn solder.

The bump-bonding method discussed above allows larger contact areas between leader electrodes 13 and bumps 7, so that bonding reliability can be increased. On the other hand, if the heating at the bump bonding produces thermal strain, electrode-film sometimes peals off and the bonding reliability decreases. The present invention is based on the finding that when at least the upper most layer of the electrode-film is formed by evaporation, the thermal strain at the bump bonding can be moderated, which prevents the electrode-film from peeling off. Further, the film made by evaporation has another advantage that it suppresses electrochemical corrosion to the electrode-film during the step of cutting or washing.

Because the evaporated film tends to form thin film having the same orientation as the material, so that the bonding between metal grains is supposed to be strengthened. Therefore, at least the upper most layer that contacts with the bumps is formed by evaporation, then the electrode-film can not be peeled off by distortion due to the bonding, and the electrochemical corrosion can be also suppressed.

Metallic thin film to be formed by evaporation is preferably made of soft material because of better bonding with bumps. As the soft material, aluminum, Au, Al—Cu alloy made from aluminum plus at least one of Cu, Sc, Cr, Ni, or Ti can be used.

On top of the upper most layer that contacts with bumps, another layer can be formed by evaporation. This structure can also produce a similar advantage.

The location where bumps are formed is, of course, not limited to the locations shown in FIG. 1A. Further, belt-like input/output leader electrodes 4a, 5a and input/output terminal electrodes 4b, 5b are electrically independent of each other. Therefore, electrical properties of respective devices 10 can be measured by applying probes to their input/output terminal electrodes 4b, 5b with given electrode patterns kept formed on substrate 1 as shown in FIG. 1B. Accordingly, screening on properties can be done before elastic surface devices 10 are cut into pieces, and conforming pieces only can be collected to assemble electronic components after the cutting.

As discussed above, according to the present invention, surround comb electrodes 2 and reflector electrodes 3 with frame-like short-circuited auxiliary electrode 6 of which width varies depending on places, and form at least the upper most layer that contacts with bumps 7 by evaporation. This structure can reduce the electric potential differences produced by pyroelectricity of piezoelectric substrate 1. Further, this structure can prevent peeling off of the electrode-film at bonded sections, and suppress electrochemical corrosion. Laminated electrode-film increase withstand electric power, so that when accumulated electric charges develop an electric discharge, the electrode-film is hardly to be damaged, which further strengthens the withstand electric discharge.

In manufacturing electronic components to which SAW devices 10 are mounted, not only the bump-bonding method discussed above but also, e.g., a wire-bonding method can be used for bonding.

Exemplary Embodiment 2

Figure 3:
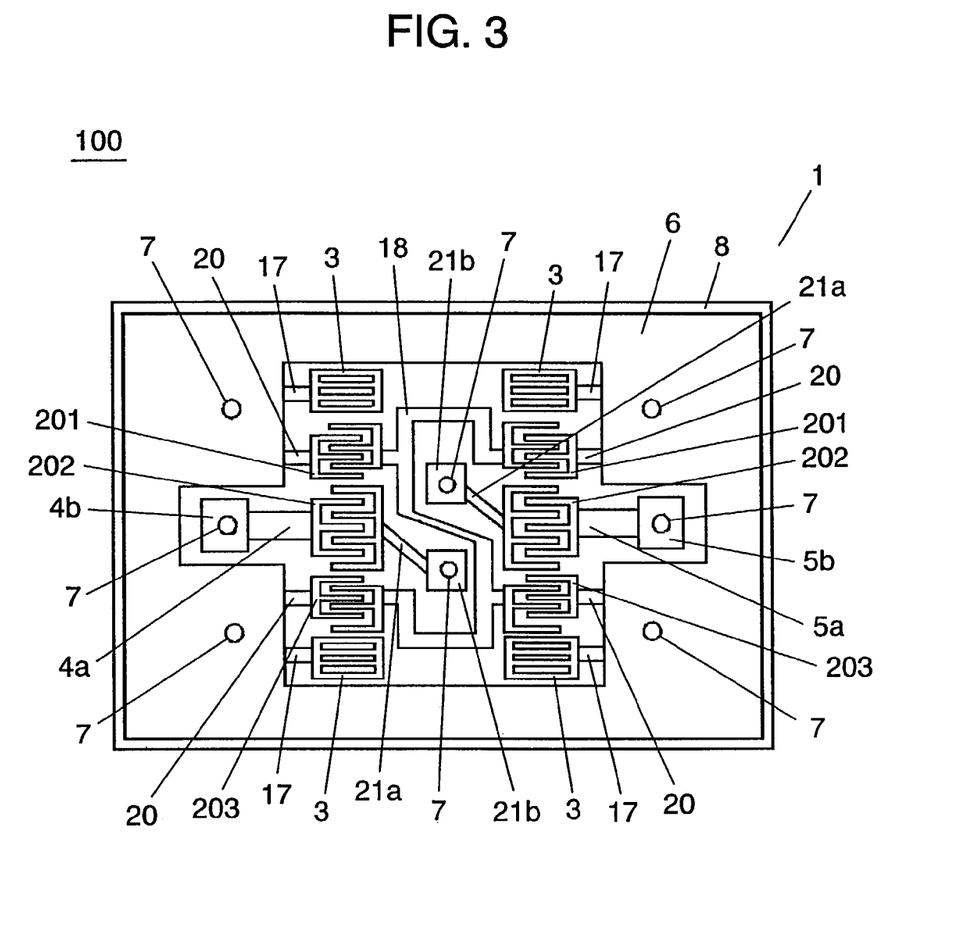
FIG. 3 is a plan view showing a structure of electrode patterns of a SAW device in accordance with a second exemplary embodiment of the present invention.

The second exemplary embodiment of the present invention is demonstrated hereinafter with reference to FIG. 3. In FIG. 3, the same elements as those in FIG. 1A have the same reference marks.

A pair of structures are prepared, each one of them has three comb electrodes 201, 202, 203, and reflector electrodes 3 disposed on both sides of the three comb electrodes. At each one of center comb electrodes 202 placed between electrodes 201 and 202, input/output leader electrodes 4a, 5a, input/output terminal electrodes 4b, 5b, grounding leader electrode 21a, and grounding terminal electrode 21b are disposed as shown in FIG. 3. Frame-like short-circuited auxiliary electrode 6 is formed such that electrode 6 surrounds the configuration discussed above. Reflector electrodes 3 on both the sides are electrically coupled with each other via first connecting electrode 17, and comb electrodes 201, 203 on both sides are electrically coupled with each other via second connecting electrode 20 with respect to short-circuited auxiliary electrode 6. Outside electrode 6, there remains clearance 8 after dicing. The surface of substrate 1 is exposed from clearance 8. The other ends of comb electrodes 201, 203 are coupled with each other via belt-like electrode 18. Bumps 7 are prepared on input/output electrodes 4b, 5b and auxiliary electrode 6 at given places. SAW device 100 is thus constructed. A manufacturing method of an electronic component using this SAW device 100 is similar to that demonstrated in the first embodiment, the description thereof is thus omitted here.

In the foregoing structure, reflector electrode 3 and comb electrodes 201, 203 on both sides are coupled with short-circuited auxiliary electrode 6 via belt-like first connecting electrode 17 and the second connecting electrode. Thus wide areas of SAW device 100 are commonly connected and have an identical electric potential. As a result, if device 100 undergoes temperature changes and electric potentials occur due to pyroelectricity of substrate 1, this structure including an open electrode-pattern allows to substantially reduce electric potential differences.

An effect of the electrical coupling of comb electrodes 201, 203, reflector electrodes 3 with short-circuited auxiliary electrode 6 depends on a design of the electrode-patterns; however, the design is only required to lower an impedance in order to uniform electric potentials, and there is no limitation about a width of electrodes or a number of electrodes. It is preferable, however, to have a width of as wide as possible and electrodes as many as possible, for producing more effective result.

In this embodiment, since the electrodes including comb electrodes 201, 203 and reflector electrodes 3 are commonly coupled, respective sections eventually have an identical electric potential even if different electric potentials occur at the respective sections. As a result, excellent SAW device 100, free from damages of the electrodes or degradation in properties due to an electric discharge, can be manufactured with ease.

Exemplary Embodiment 3

Figure 4:
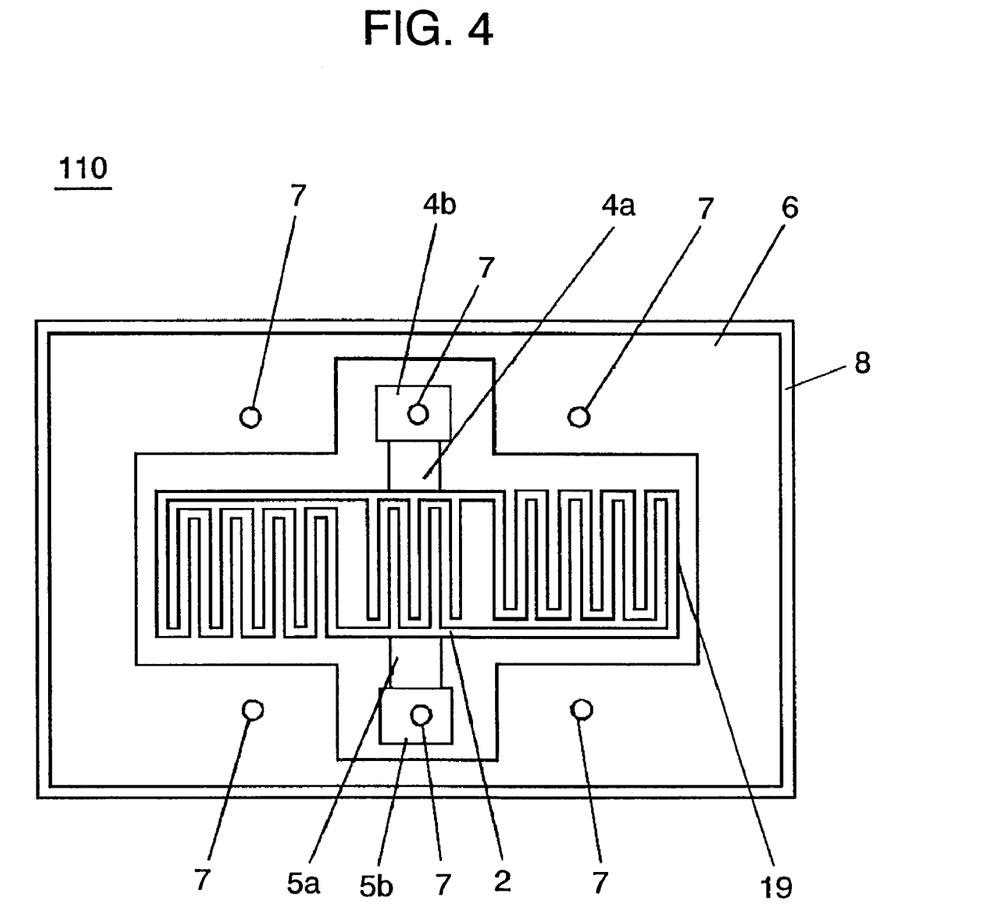
FIG. 4 is a plan view showing a structure of electrode patterns of a SAW device in accordance with a third exemplary embodiment of the present invention.

The third exemplary embodiment of the present invention is demonstrated hereinafter with reference to FIG. 4. In FIG. 4, the same elements as those in FIG. 1A have the same reference marks.

In this embodiment, reflector electrode 19 is formed of meander lines, and both the ends of electrode 19 are electrically coupled with comb electrodes 2 as shown in FIG. 4. In other words, except the electric coupling of reflector electrode 19 formed of meander lines with comb electrodes 2, the structure of the third embodiment is the same as that used in the first embodiment. Further, a method of manufacturing an electronic component using SAW device 110 and base substrate 9, lid 15 shown in FIG. 2 is similar to that demonstrated in the first embodiment.

In FIG. 4, reflector electrode 19 formed of meander lines is electrically coupled with comb electrodes 2, and they become conductive when a dc signal is used or in a low frequency region. However, in a high frequency region where SAW device 110 usually works, the impedance in the meander lines increases, so that electrodes 19 and 2 actually become open. On the other hand, since reflector electrode 19 formed of meander lines is electrically coupled with comb electrodes 2, electric charges developed due to pyroelectricity of piezoelectric substrate 1 can be uniformed in wider areas of the electrodes. As a result, electric potential differences can be reduced.

In other words, the electric coupling of reflector electrode 19 formed of meander lines with comb electrodes 2 allows these two types of electrodes to be actually open in a high frequency region, i.e., an actual working condition, and no inconvenience occurs in operation of SAW device 110. As for the electric potential due to pyroelectricity, electric conductivity between comb electrodes 2 and reflector electrode 19 allows to reduce the electric potential differences.

Further, belt-like input/output leader electrodes 4a, 5a coupled with comb electrodes 2 are disposed opposite to each other, and electrodes 4a, 5a have an approx. equal area. Input/output terminal electrodes 4b, 5b coupled with electrodes 4a, 5a are also disposed opposite to each other, and they have approx. an equal area. This structure substantially eliminates electric potential differences even if the respective electrode patterns have electric potentials due to pyroelectricity. As a result, excellent SAW device 110, free from damages of the electrodes or degradation in properties due to an electric discharge, can be manufactured with ease.

Exemplary Embodiment 4

Figure 5A:
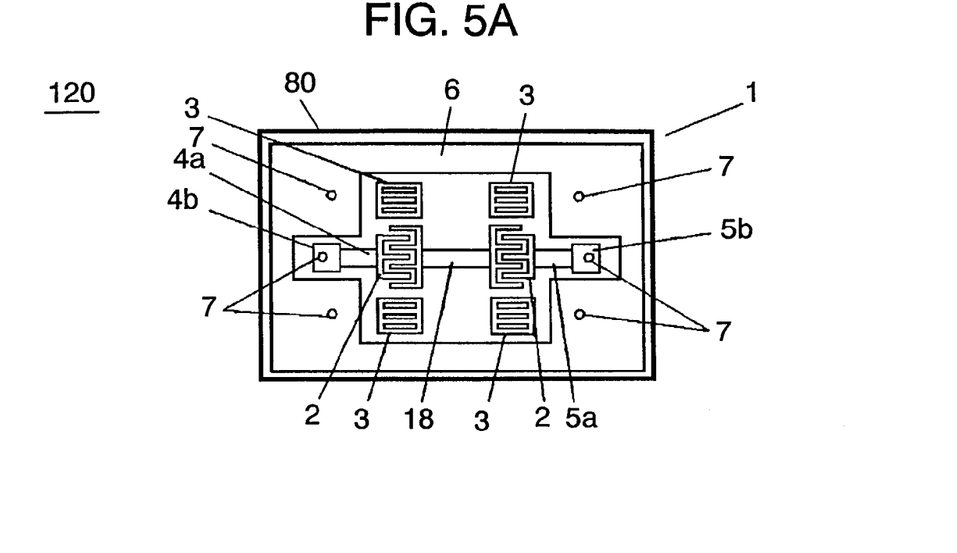
FIG. 5A is a plan view showing a structure of electrode patterns of a SAW device in accordance with a fourth exemplary embodiment of the present invention.
Figure 5B:
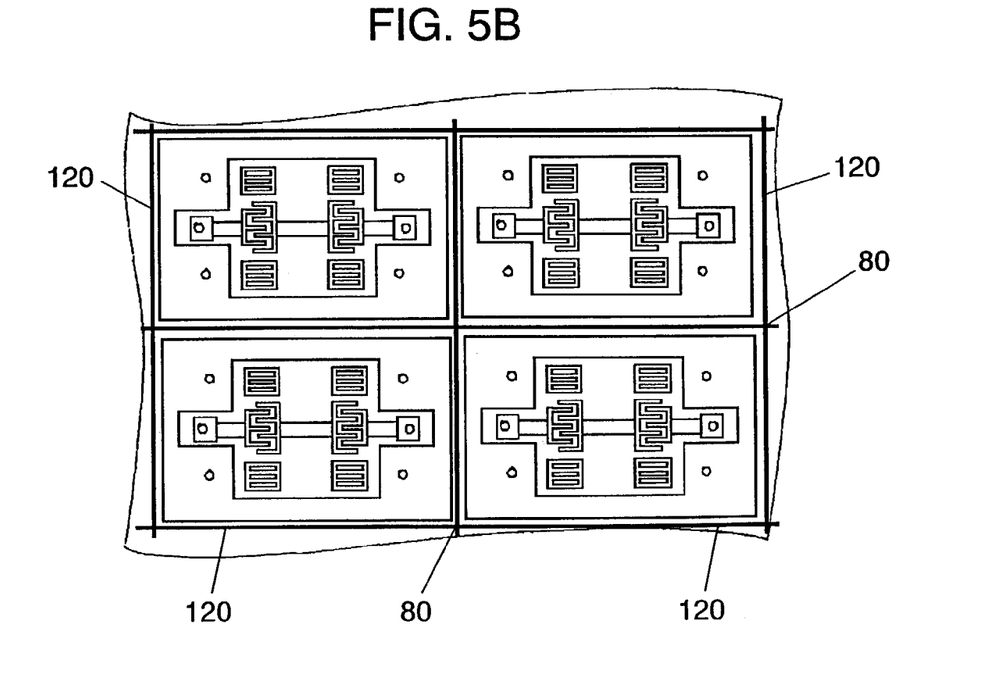
FIG. 5B is a plan view showing a plurality of the SAW devices formed on a piezoelectric substrate.

The fourth exemplary embodiment of the present invention is demonstrated hereinafter with reference to FIGS. 5A and 5B. FIG. 5A is a plan view showing a structure of an electrode pattern, and FIG. 5B is a plan view showing a plurality of the SAW devices formed on a piezoelectric substrate. In FIGS. 5A and 5B, the same elements as those in FIG. 1A have the same reference marks. SAW device 120 in accordance with this fourth embodiment differs from SAW device 10 of the first embodiment only in forming dicing lines 80 made of the same material as the electrodes at outer periphery of device 10. In other words, when the substrate is cut along dicing lines into pieces, the dicing lines disappear; however, dicing lines 80 of the fourth embodiment have a width wide enough to positively remain at the outer periphery after the dicing.

In this embodiment, dicing lines 80 electrically shorted with SAW device 120 are disposed on substrate 1 together with device 120. This structure allows to uniform electric potential differences between the respective electrode patterns if a large electric potential due to pyroelectricity which is activated by a large temperature change to the substrate before the dicing. After substrate 1 is diced into pieces, parts of dicing lines 80 remain keeping a frame-like shape at the outer periphery of SAW device 120, so that the electric potential differences are further reduced. A dicing device cuts substrate 1 along on dicing lines 80, so that registration accompanying the cutting can be done with ease.

If plural sets of comb electrodes 2 and reflector electrodes 3 are disposed on a SAW device, the device can obtain similar advantages to those discussed above. A manufacturing method of SAW device 120 in accordance with the fourth embodiment is similar to the method of manufacturing device 10 in accordance with the first embodiment except the dicing of substrate 1 along on dicing lines 80.

Exemplary Embodiment 5

Figure 6:
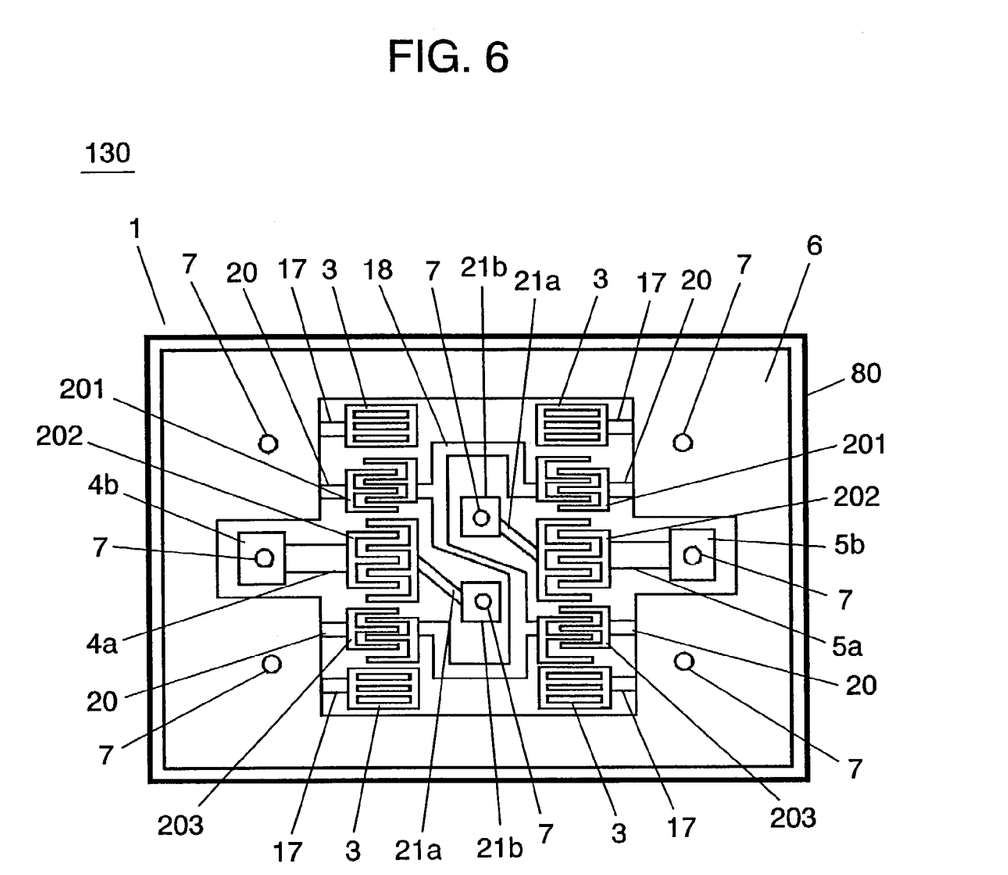
FIG. 6 is a plan view showing a structure of electrode patterns of a SAW device in accordance with a fifth exemplary embodiment of the present invention.

The fifth exemplary embodiment of the present invention is demonstrated hereinafter with reference to FIG. 6. In FIG. 6, the same elements as those in FIG. 3 have the same reference marks. SAW device 130 in accordance with this fifth embodiment differs from SAW device 100 of the second embodiment only in forming dicing lines 80 made of the same material as the electrodes at outer periphery of device 100. Shape, structure and method of manufacturing are the same, except the item discussed above, as those in the second embodiment. Dicing lines 80 of the fifth embodiment have a width wide enough to positively remain at the outer periphery after the dicing.

Second connecting electrode 20, which electrically couples comb electrodes 201, 203 with short-circuited auxiliary electrode 6, is preferably tapered at its pattern width toward, e.g., electrode 6, because it is not desirable to have a high impedance section at some midpoints of its pattern. The width of second connecting electrode 20 is preferably wider than that of dicing line 80.

Dicing lines 80 are provided as discussed above, and they remain keeping a frame-like shape after the cutting, so that devices 130 on substrate 1 can be kept stable against temperature changes during working steps. When devices 130 as the pieces are mounted to a base substrate, a temperature changes; however they are free from damages or degradation in properties due to an electric discharge. Electronic components using this excellent SAW device can be manufactured with ease.

Exemplary Embodiment 6

Figure 7:
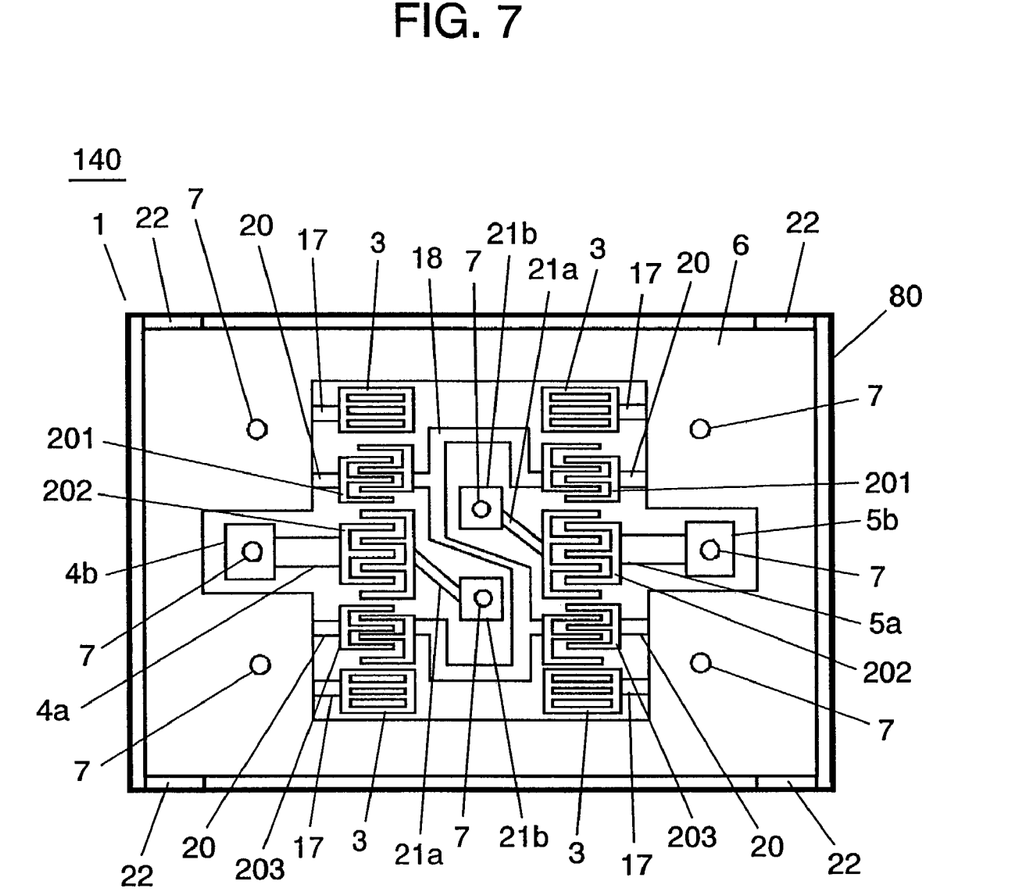
FIG. 7 is a plan view showing a structure of electrode patterns of a SAW device in accordance with a sixth exemplary embodiment of the present invention.

The sixth exemplary embodiment of the present invention is demonstrated hereinafter with reference to FIG. 7, which is a plan view showing a structure of electrode-patterns of SAW device 140 in accordance with the sixth embodiment. In FIG. 7, the same elements as those in FIG. 6 have the same reference marks. As shown in FIG. 7, SAW device 140 in accordance with the sixth embodiment has third connecting electrodes 22, which electrically couple dicing lines 80 with short-circuited auxiliary electrode 6 in device 130 of the previous fifth embodiment. A method of manufacturing electronic components using this SAW device 140 is similar to that demonstrated in the first embodiment, and the construction of the electronic components is also similar to that of the first embodiment. In this sixth embodiment, the width of dicing lines 80 is wide enough to positively remain at the outer periphery after the dicing.

As discussed above, short-circuited auxiliary electrode 6 is electrically coupled with dicing lines 80 via third connecting electrodes 22, so that electric potentials become uniform throughout the electrodes including comb electrodes 201, 203 on both sides, reflector electrodes 3, electrode 6 and dicing lines 80 even if electric charges occur in piezoelectric substrate 1, because they are commonly coupled electrically. This structure further effectively prevents an electric discharge due to an electric potential difference from occurring.

The electrode patterns electrically connecting dicing lines 80, short-circuited auxiliary electrode 6, comb electrodes 201, 203 on both sides and reflector electrodes 3 can be line-shaped or belt-like as long as they have a low impedance. There is no limit to a number of electrode patterns.

Exemplary Embodiment 7

Figure 8:
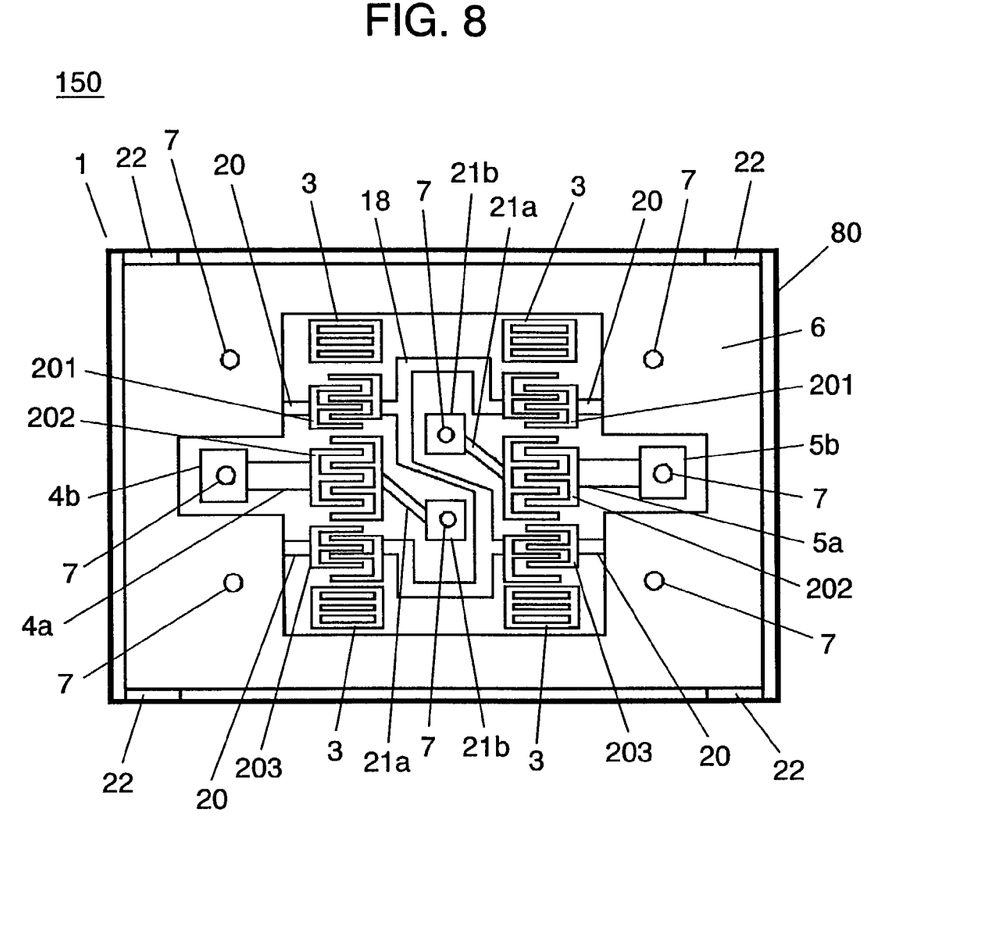
FIG. 8 is a plan view showing a structure of electrode patterns of a SAW device in accordance with a seventh exemplary embodiment of the present invention.

The seventh exemplary embodiment of the present invention is demonstrated hereinafter with reference to FIG. 8. In FIG. 8, the same elements as those in FIG. 6 have the same reference marks. As shown in FIG. 8, SAW device 150 in accordance with the seventh embodiment differs from device 140 of the sixth embodiment only in reflector electrodes 3 left open from the short-circuited auxiliary electrode. Other respects and the method of manufacturing are similar to those of SAW device 140.

Since comb electrodes 201, 203 on both sides, short-circuited auxiliary electrode 6 and dicing lines 80 are commonly connected electrically, when electric charges occur in piezoelectric substrate 1, this structure allows to reduce electric potential differences between those elements although comb electrode 202 and reflector electrodes 3 are electrically open. As a result, this structure can reduce electric potential differences and suppress an electric discharge, so that a reliable SAW device is obtainable and an electronic component using this device can be realized.

Exemplary Embodiment 8

Figure 9:
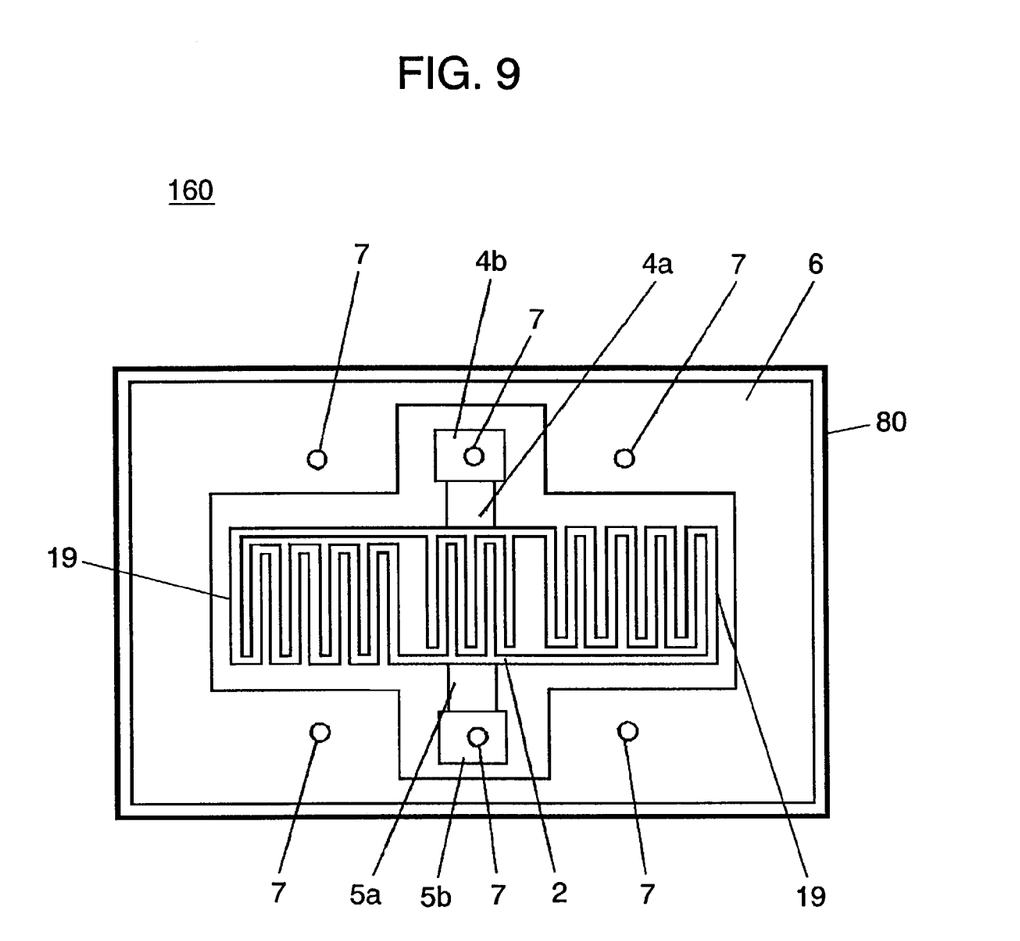
FIG. 9 is a plan view showing a structure of electrode patterns of a SAW device in accordance with an eight exemplary embodiment of the present invention.

The eighth exemplary embodiment of the present invention is demonstrated hereinafter with reference to FIG. 9, which is a plan view illustrating a structure of electrode-patterns of SAW device 160 in accordance with the eight embodiment. In FIG. 9, the same elements as those in FIG. 4 have the same reference marks. SAW device 160 in accordance with this eighth embodiment differs from SAW device 110 of the third embodiment only in forming dicing lines 80 at the outer periphery of device 110. Other respects and the method of manufacturing are similar to those in the third embodiment except the item discussed above. Dicing lines 80 of the eighth embodiment have a width wide enough to positively remain at the outer periphery after the dicing.

Similar to the description about SAW device 110 in the third embodiment, in this SAW device 160, reflector electrodes 19 formed of meander lines is electrically coupled with comb electrodes 2. When a dc signal is used or in a low frequency range, reflector electrodes 19 and comb electrodes 2 are conductive. However, in a high frequency region where SAW device 160 usually works, the impedance in the meander lines increases, so that electrodes 19 and 2 actually become open, which does not influence to the electric properties of device 160. This is similar to device 110 demonstrated in the third embodiment.

In SAW device 160 of this embodiment, reflector electrode 19 formed of meander lines is electrically coupled with comb electrodes 2, and frame-like dicing lines 80 similar to frame-like short-circuited auxiliary electrode 6 are provided. Therefore, electric charges generated by pyroelectricity of piezoelectric substrate 1 are uniformed at the respective electrode-patterns, thereby further reducing the electric potential differences at respective parts.

In this embodiment, dicing lines 80 and short-circuited auxiliary electrode 6 are electrically open; however, the present invention is not limited to this structure, and electrode 6 is electrically coupled with dicing lines 80 via one or more than one connecting electrode.

In embodiment 1 through embodiment 8, a pair of a comb electrode and a reflector electrode or two pairs of them are prepared; however, the present invention is not limited to this structure, and more numbers of multi-step structure can produce similar advantages to those discussed above.

INDUSTRIAL APPLICABILITY

According to the present invention, a frame-like short-circuited auxiliary electrode, of which width varies depending on places, surrounds comb electrodes and a reflector electrode. This structure allows to reduce electric potential differences between electrode-patterns when electric charges occur due to the pyroelectricity of the substrate, which is activated by a temperature change, not only in working steps on a substrate-by-substrate basis but also after the dicing, i.e., in working steps on a piece-by-piece basis. As a result, an electric discharge can be prevented, and a SAW device free from damages or degradation in properties is obtainable, further, an electronic component using this device can be manufactured with ease.

What is claimed is:

1. A surface acoustic wave (SAW) device comprising:
   a piezoelectric substrate;
   a comb electrode formed on said substrate;
   a reflector electrode disposed adjacent said comb electrode; and
   a frame-like short-circuited auxiliary electrode, of which width varies depending on places, for surrounding said comb electrode and said reflector electrode,
   wherein a part of said comb electrode is electrically coupled with said auxiliary electrode.

2. The SAW device of claim 1, further comprising a dicing line at outer periphery of said auxiliary electrode,
   wherein an input/output leader electrode to be coupled with said comb electrode and an input/output terminal electrode to be coupled with the leader electrode are disposed at an inner periphery of said frame-like auxiliary electrode, and
   a part of said comb electrode is electrically coupled with said auxiliary electrode.

3. The SAW device of claim 1, wherein at least three pairs of said comb electrodes are disposed at given places, and said comb electrodes on both sides of the plurality of said electrodes are coupled with each other and also electrically coupled with said auxiliary electrode.

4. The SAW device of claim 2, wherein at least three pairs of said comb electrodes are disposed at given places, and said comb electrodes on both sides of the plurality of said electrodes are coupled with each other and also electrically coupled with said auxiliary electrode.

5. The SAW device of claim 1, wherein said comb electrode is electrically coupled with said auxiliary electrode via at least a single second connecting electrode which is shaped like one of a line and a belt.

6. The SAW device of claim 2, wherein said comb electrode is electrically coupled with said auxiliary electrode via at least a single second connecting electrode which is shaped like one of a line and a belt.

7. A surface acoustic wave (SAW) device comprising:
   a piezoelectric substrate;
   a comb electrode formed on said substrate;
   a reflector electrode disposed adjacent said comb electrode;
   a frame-like short-circuited auxiliary electrode, of which width varies depending on places, for surrounding said comb electrode and said reflector electrode; and
   a dicing line at outer periphery of said auxiliary electrode,
   wherein said dicing line is electrically coupled with said auxiliary electrode.

8. The SAW device of claim 7, wherein said dicing line is electrically coupled with said auxiliary electrode via at least a single third connecting electrode which is shaped like one of a line and a belt.

9. The SAW device of claim 8, wherein the third connecting electrode has a width at least wider than that of said dicing line.

10. A surface acoustic wave (SAW) device comprising:
a piezoelectric substrate;
a comb electrode formed on said substrate;
a reflector electrode disposed adjacent said comb electrode; and
a frame-like short-circuited auxiliary electrode, of which width varies depending on places, for surrounding said comb electrode and said reflector electrode,
wherein said reflector electrode is formed of a meander line, and both ends of said reflector electrode are electrically coupled with said comb electrodes respectively.

11. The SAW device of claim 1, further comprising a bump formed on at least one of said comb electrode, said reflector electrode and said auxiliary electrode.

* * * * *